United States Patent
Sun et al.

(10) Patent No.: US 9,964,691 B2
(45) Date of Patent: May 8, 2018

(54) BACKPLANE AND BACKLIGHT MODULE HAVING THE SAME, DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Yanjun Sun, Beijing (CN); Xiong Jin, Beijing (CN); Zhanchang Bu, Beijing (CN)

(73) Assignees: BOE TECHNOLOGY GROUP CO., LTD. (CN); BEIJING BOE DISPLAY TECHNOLOGY CO., LTD. (CN)

( * ) Notice: Subject to any disclaimer, the term of this patent is extended or adjusted under 35 U.S.C. 154(b) by 405 days.

(21) Appl. No.: 14/494,786

(22) Filed: Sep. 24, 2014

(65) Prior Publication Data

US 2015/0362665 A1  Dec. 17, 2015

(30) Foreign Application Priority Data

Jun. 16, 2014  (CN) .......................... 2014 1 0268563

(51) Int. Cl.
  *G02F 1/1333*  (2006.01)
  *F21V 8/00*  (2006.01)
  *H05K 3/00*  (2006.01)

(52) U.S. Cl.
  CPC ......... *G02B 6/0088* (2013.01); *G02B 6/0066* (2013.01); *H05K 3/0058* (2013.01); *H05K 2201/10128* (2013.01)

(58) Field of Classification Search
  CPC ....... H05K 3/0058; H05K 2201/10128; G02B 6/0066; G02B 6/0088

(Continued)

(56) References Cited

U.S. PATENT DOCUMENTS 4,586,252 A * 5/1986 Faticanti ................ B23K 1/018
  228/56.1
6,237,832 B1 * 5/2001 Chung ................... B23K 3/087
  228/37

(Continued)

FOREIGN PATENT DOCUMENTS

CN  201491403  *  5/2010
CN  101886772 A  11/2010

(Continued)

OTHER PUBLICATIONS

Office Action in Chinese Patent Application No. 201410268563.9, dated Apr. 27, 2016.

*Primary Examiner* — Hoan C Nguyen
(74) *Attorney, Agent, or Firm* — Brooks Kushman P.C.

(57) ABSTRACT

A backplane for a display device which includes a plate-like body for securing a rectangular printed circuit board (PCB). The body includes a first clamping part corresponding to a first side edge of the PCB having an L-shaped bend facing towards the PCB for clamping the first side edge. The body further includes a second clamping part corresponding to a second side edge of the PCB having a U-shaped bend facing towards the PCB for clamping the second side edge. The second side edge is parallel to the first side edge. A riveting column is secured on the body uncovered by the PCB, the riveting column is located at the same side of the PCB as the first clamping part, and a spring is secured on the riveting column and presses the edge of the PCB against the body.

20 Claims, 3 Drawing Sheets

(58) Field of Classification Search
USPC .................................................. 349/58, 61
See application file for complete search history.

(56) References Cited

U.S. PATENT DOCUMENTS

| | | | |
|---|---|---|---|
| 7,374,306 B2 | 5/2008 | Liu | |
| 2007/0273807 A1* | 11/2007 | Yun | G02F 1/13452 349/58 |
| 2008/0049444 A1* | 2/2008 | Hsiao | G02B 6/009 362/611 |
| 2010/0033191 A1* | 2/2010 | Lee | G01R 31/001 324/555 |
| 2010/0165233 A1* | 7/2010 | Jung | G02B 6/009 349/58 |
| 2011/0025942 A1* | 2/2011 | Lee | G02F 1/133615 349/58 |
| 2011/0170034 A1* | 7/2011 | Jeong | G02B 6/0068 349/61 |
| 2014/0003090 A1* | 1/2014 | Chang | G02B 6/0091 362/612 |
| 2015/0342069 A1* | 11/2015 | Foong | H05K 3/303 361/749 |

FOREIGN PATENT DOCUMENTS

| | | | |
|---|---|---|---|
| CN | 202812959 U | | 3/2013 |
| CN | 203027611 | * | 6/2013 |
| CN | 203261612 U | | 10/2013 |
| CN | 103529596 A | | 1/2014 |
| CN | 203708643 U | | 7/2014 |
| DE | 20015037 | * | 7/2001 |
| JP | 04288899 A | * | 10/1992 |

* cited by examiner

-PRIOR ART-

US 9,964,691 B2

BACKPLANE AND BACKLIGHT MODULE HAVING THE SAME, DISPLAY DEVICE

CROSS-REFERENCE TO RELATED APPLICATION

The present application claims a priority of the Chinese patent application No. 201410268563.9 filed in China on Jun. 16, 2014, which is incorporated herein by reference in its entirety.

TECHNICAL FIELD

The present disclosure relates to components of a liquid crystal display (LCD), and in particular, to a backplane and a backlight module having the same, and a display device.

BACKGROUND

Backplane is a component in a backlight module for securing a light guide plate. A backlight module further includes a light bar for providing light source and a printed circuit board (PCB) for allowing the light bar to work normally.

In order to decrease a thickness of a backlight module to realize thinning of a display device, a PCB 11 is generally secured to a backplane by means of adhesion, as shown in FIG. 1. A surface of the PCB 11 where no circuit is formed is adhered to a backplane 12 by using a double-sided adhesive tape 13. Securing a PCB in this way can make the thickness of the backlight module smaller than the thickness of an existing backlight module with a PCB secured by other methods by about 0.5 mm-0.6 mm.

During the process of using the backlight module shown in FIG. 1, the inventor found that the PCB 11 adhered to the backplane 12 by using a double-sided adhesive tape 13 is not easy to disassemble, and the removed PCB 11 can be easily broken and thus cannot be reused. In addition, a backplane 12 with residual double-sided adhesive has to be subjected to a special adhesive removal process in order to install a new PCB 11, which deteriorates the rework of the backlight module.

SUMMARY

An embodiment of the present disclosure provides a backplane and a backlight module having the same, and a display device, in order to solve the problem that a PCB adhered to the backplane in an existing thin backlight module cannot be easily disassembled, which deteriorates the rework of the backlight module.

In order to achieve the above purpose, an embodiment of the present disclosure adopts the following technical solutions:

A backplane may include a plate-like body for securing a rectangle printed circuit board (PCB). The body may include a first clamping part corresponding to a first side edge of the PCB having an L-shaped bend facing towards the PCB for clamping the first side edge. The body may further include a second clamping part corresponding to a second side edge of the PCB having a U-shaped bend facing towards the PCB for clamping the second side edge. The second side edge is parallel to the first side edge.

A riveting column is secured on the body uncovered by the PCB, the riveting column is located at the same side of the PCB as the first clamping part, and a spring is secured on the riveting column and presses the edge of the PCB against the body.

Optionally, the spring may be rotatably secured on the riveting column using a central axis of the riveting column as a rotation axis.

Optionally, materials of the riveting column and the spring may be both made of metal.

Furthermore, the body may further include a third clamping part and a fourth clamping part respectively corresponding to a third side edge and a fourth side edge parallel each other on the PCB, and the third clamping part and the fourth clamping part have bends facing towards the PCB for clamping the third side edge and the fourth side edge.

Optionally, the bend may be an L-shaped bend or a U-shaped bend, and the bend of at most one of the third clamping part and the fourth clamping part may be a U-shaped bend.

Optionally, the riveting column and the body may be secured by means of welding or screw joint.

Furthermore, a gap between the bend and the PCB clamped in the bend may be approximately 0-0.2 mm.

A backlight module which includes the above backplane is also provided.

A display device which includes the above backlight module is also provided.

In the backplane and backlight module having the same, and display device provided in the embodiments of the present disclosure, the first side edge 32 and the second side edge 33 parallel to each other on a rectangular PCB 31 can be clamped by a first clamping part 22 having an L-shaped bend and a second clamping part 23 having a U-shaped bend on a body. In addition, the edge of the PCB adjacent to the first side edge can be clamped between a spring 25 and a body 21 by a riveting column 24 and a spring 25 secured thereon disposed on the body 21 at the same side as the first clamping part 22. Thereby securing the PCB on the body 21 can be achieved without using double-sided adhesive tape, and thus solving the problem that a PCB adhered to the backplane in an existing thin backlight module cannot be easily disassembled, which deteriorates the rework of the backlight module.

DESCRIPTION OF DRAWINGS

To illustrate the solutions according to the embodiments of the present disclosure or in the prior art more clearly, the accompanying drawings needed for describing the embodiments or the prior art are introduced below briefly. Apparently, the accompanying drawings in the following descriptions merely show some of the embodiments of the present disclosure, and persons skilled in the art may obtain other drawings according to the accompanying drawings without creative efforts.

DETAILED EMBODIMENTS

Figure 1:
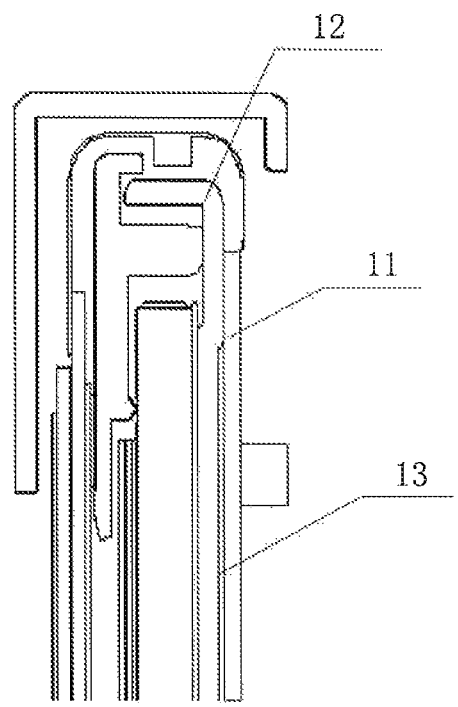
FIG. 1 is a partial sectional view of a side of a backlight module in the prior art.

The technical solutions of the embodiments will be described in a clearly and fully understandable way in connection with the drawings related to the embodiments of the present disclosure. Obviously, the described embodiments are just a part but not all of the embodiments of the present disclosure. All other embodiment(s) obtained by those skilled in the art based on the described embodiments herein without creative efforts should be within the scope of the present disclosure.

An embodiment of the present disclosure provides a backplane, as shown in FIGS. 2-5, including a plate-like body 21 for securing a rectangle PCB 31. The body 21 includes a first clamping part 22 corresponding to a first side edge 32 of the PCB 31 having an L-shaped bend facing towards the PCB 31 for clamping the first side edge 32. The body 21 further includes a second clamping part 23 corresponding to a second side edge of 33 the PCB 31 having a U-shaped bend facing towards the PCB 31 for clamping the second side edge 33. The second side edge 33 is parallel to the first side edge 32. A riveting column 24 is secured on the body 21 uncovered by the PCB 31, the riveting column 24 is located at the same side of the PCB 31 as the first clamping part 22, and a spring 25 is secured on the riveting column 24 and presses the edge of the PCB 31 against the body 21.

In the backplane provided an embodiment of the present disclosure, the first side edge 32 and the second side edge 33 parallel to each other on a rectangular PCB 31 can be clamped by a first clamping part 22 having an L-shaped bend and a second clamping part 23 having a U-shaped bend on a body. In addition, the edge of the PCB 31 adjacent to the first side edge can be clamped between a spring 25 and a body 21 by a riveting column 24 and a spring 25 secured thereon disposed on the body 21 at the same side as the first clamping part 22. Thereby securing the PCB on the body 21 can be achieved without using double-sided adhesive tape, and thus solving the problem that a PCB adhered to the backplane in an existing thin backlight module cannot be easily disassembled, which deteriorates the rework of the backlight module.

Figure 4:
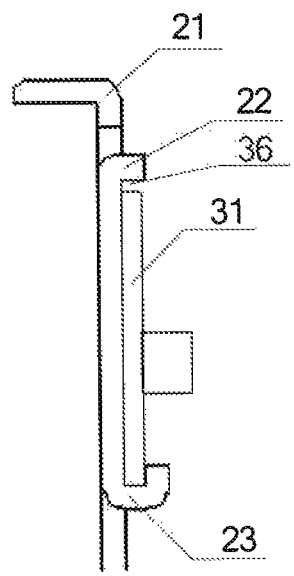
FIG. 4 is a sectional view along the line C-C' in FIG. 3 according to some embodiments of the present disclosure.
Figure 5:
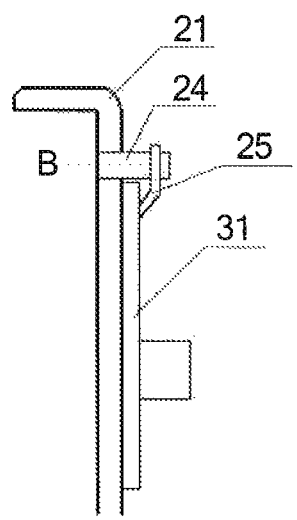
FIG. 5 is a sectional view along the line D-D' in FIG. 3.

Moreover, the bend part does not need to be very high, as long as it can clamp the first side edge 32 and the second side edge 33. Generally, the bend part is as high as or a little higher than the thickness of the side edge of the PCB 31, as shown in FIG. 4. But it would not exceed a sum of the thickness of the side edge of the PCB 31 and the thickness of the thickest chip 34 on the PCB. In addition, as shown in FIG. 5, a top surface of the riveting column 24 is generally not higher than a top surface of the thickest chip 34. Therefore, the thickness of the backlight module provided in an embodiment of the present disclosure is decreased (at least the thickness of the double-sided adhesive tape is decreased) as compared with that of the thin backlight module provided in the prior art as shown in FIG. 1.

Figure 2:
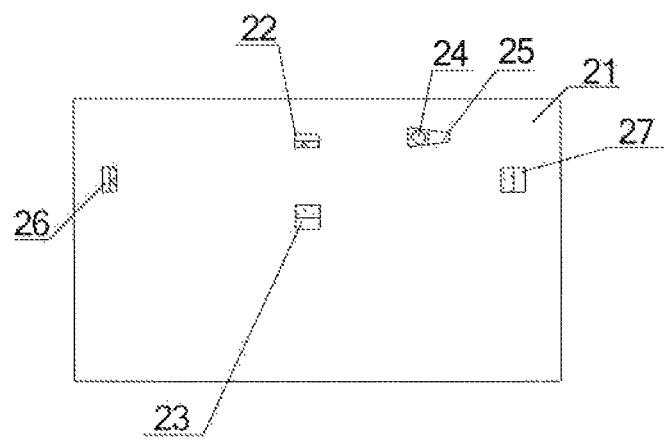
FIG. 2 is a plan view of a backplane provided in an embodiment of the present disclosure.
Figure 3:
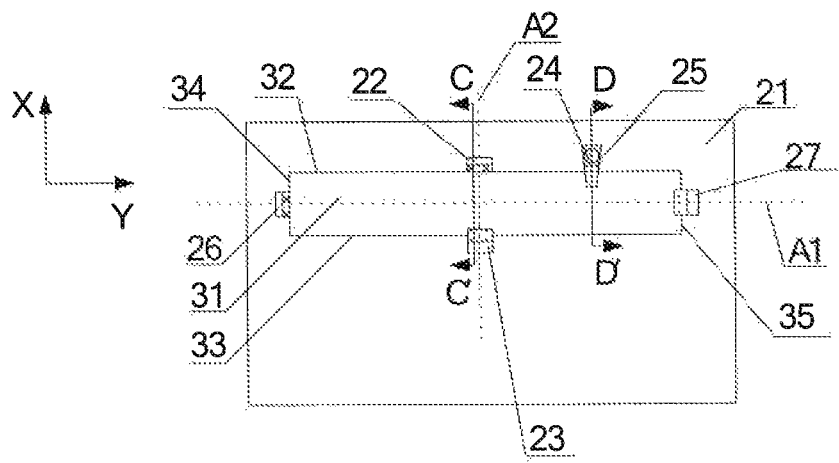
FIG. 3 is a plan view of the backplane as shown in FIG. 2 provided with a PCB.

In addition, the number of the first clamping part(s) 22 is not limited to one as shown in FIG. 2 and FIG. 3, and it may also be set according to a length of the first side edge 32 in the secured PCB 31 and a length of the first clamping part 22 along the direction parallel to the first side edge 32. When the first side edge 32 is relatively long, while the length of the first clamping part 22 along the direction parallel to the first side edge 32 is relatively short, there may be a plurality of the first clamping parts 22. Similarly, there may also be a plurality of the second clamping parts 23 and a plurality of riveting columns 24 and springs 25.

Furthermore, as shown in FIG. 3, the first clamping part 22 and the second clamping part 23 are symmetrically disposed taking a central line A1 of the PCB 31 parallel to direction Y as a symmetry axis. Of course, the embodiments disclosed in the present disclosure are not limited thereto, and the first clamping part 22 and the second clamping part 23 may also not be symmetrically disposed taking a central line A1 of the PCB 31 as a symmetry axis.

In the backplane provided in the above embodiment of the present disclosure, the spring 25 may be rotatably secured on the riveting column 24 taking a central axis B (as shown in FIG. 5) of the riveting column 24 as a rotation axis. When it needs to install the PCB 31 onto the backplane, the spring 25 is firstly rotated to any position other than an installation position of the PCB 31, as long as the PCB 31 is not prevented from being placed on the body 21. Afterwards, the first side edge 32 and the second side edge 33 of the PCB 31 are clamped between the first clamping part 22 and the second clamping part 23. Finally, the spring 25 is rotated to a position above PCB 31 to make it press against the PCB 31. This can avoid the fixed spring 35 from affecting installation of the PCB 31, thereby improving installation convenience.

Since PCB is prone to be interfered by static electricity during work, a method of connecting wires on a PCB to a backplane by additionally sticking conductive fabrics or metal copper foils is usually adopted in the prior art, thereby achieving grounded conduction of the PCB. However, this method requires a lot of labor, takes a lot of time and consumes a lot of materials, and thus increases the cost of a backlight module. In the backplane provided in an embodiment of the present disclosure, the materials of the riveting column 24 and the spring 25 are both made of metal, and when the spring 25 presses against the PCB 31, it contacts the surface of the PCB 31 on which a chip is installed, and then the static electricity in a wire of the PCB 31 can be transmitted to the backplane via the metallic spring 25 and riveting column 24. Such a configuration utilizes a structure where a backplane is used to secure the PCB 31, without the need of additional materials or processes, and thus can save the cost of the backlight module.

In addition, in the backplane provided in the above embodiment, the bends of the first clamping part 22 and the second clamping part 23 clamp two side edges on the PCB 31 parallel to each other, thereby ensuring that there is no displacement happened in direction X perpendicular to the first side edge 32 (or the second side edge 33) on a plane of the surface of the body 21. The elasticity of the spring 25 ensures that the PCB 31 will not displace in other directions either. However, when the force exerted on the PCB 31 in direction Y parallel to the first side edge 32 (or the second side edge 33) is so big that the elasticity of the spring 25 cannot prevent the PCB 31 from displacing in direction Y, the body 21 may further include a third clamping part 26 and a fourth clamping part 27 respectively corresponding to a third side edge and a fourth side edge on the PCB 31 parallel to each other. The third clamping part 26 and the fourth clamping part 27 have bends facing towards the PCB 31 for clamping the third side edge 34 and the fourth side edge 35.

Preferably, the bends may be L-shaped bends or U-shaped bends, and the bend of at most one of the third clamping part 25 and the fourth clamping part 27 is a U-shaped bend. That is, when the third clamping part 26 has a U-shaped bend, then the bend of the fourth clamping part 27 can only be an L-shaped bend. When the fourth clamping part 27 has a U-shaped bend, then the bend of the third clamping part 26 can only be an L-shaped bend. Alternatively both the bends of the third clamping part 25 and the fourth clamping part 27 are L-shaped bends. The purpose of such a configuration is to facilitate installation of the PCB 31.

In FIG. 2 and FIG. 3, the third clamping part 26 has an L-shaped bend for clamping the third side edge 34. The fourth clamping part 27 has a U-shaped bend for clamping the fourth side edge 35. Upon comparison, the U-shaped bend has a better clamping effect for the side edge of the PCB 31.

In addition, the number of the third clamping part(s) 26 is not limited to one, and it may also be set according to a length of the third side edge 34 in the secured PCB 31 and a length of the third clamping part 26 along the direction parallel to the third side edge 34. When the third side edge 34 is relatively long, while the length of the third clamping part 26 along the direction parallel to the third side edge 34 is relatively short, there may be a plurality of the third clamping parts 26. Similarly, there may also be a plurality of the fourth clamping parts 27.

Moreover, as shown in FIG. 3, the third clamping part 26 and the fourth clamping part 27 are symmetrically disposed taking a central line A2 of the PCB 31 parallel to direction X as a symmetry axis. Of course, the embodiments disclosed in the present disclosure are not limited thereto, and the third clamping part 26 and the fourth clamping part 27 may also not be symmetrically disposed taking a central line A2 of the PCB 31 as a symmetry axis.

Figure 6:
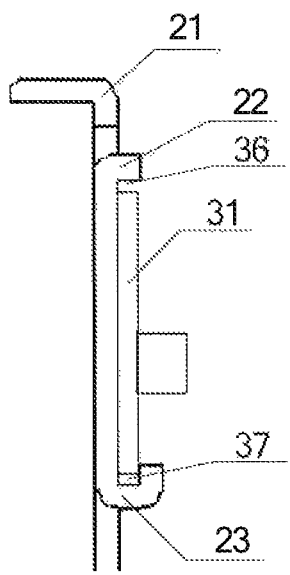
FIG. 6 is a sectional view along the line C-C' in FIG. 3 according to some embodiments of the present disclosure.

In order that the PCB 31 can be easily installed on the backplane provided in an embodiment of the present disclosure, a gap between the bend and the PCB clamped in the bend may be set to be about 0-0.2 mm. As shown in FIG. 4, there exists a gap 36 between the L-shaped bend of the first clamping part 22 and the side edge of the PCB 31, and the gap may be 0-0.2 mm. As shown in FIG. 6, there exist a gap 36 between the L-shaped bend of the first clamping part 22 and the side edge of the PCB 31 and a gap 37 between the U-shaped bend of the second clamping part 23 and the side edge of the PCB31, and both the gap 36 and 37 may be 0-0.2 mm. The backplane manufactured according to this dimension requirement can avoid the circumstance that the side edges of the PCB 31 and the bends have a tight fit, causing deformation of the PCB 31 or damage of the side edges of the PCB 31 during the process of installing the PCB 31.

In the backplane provided according to the above embodiments, the riveting column 24 and the body 21 are secured by means of welding or screw joint. The screw joint manner makes the riveting column 24 detachable and easy to maintain.

The backplane provided according to the above embodiments generally needs to be produced in one-piece by means of punching. When punching is performed to form the above clamping parts, a notch is firstly cut on the backplane body to form the clamping parts, the parts of the body at the two sides of the notch are separated from each other. Then, the body adjacent to the side of the PCB is pressed to form an L-shaped bend or a U-shaped bend facing towards the PCB.

Another embodiment of the present disclosure further provides a backlight module, which includes the backplane described in the above embodiments, and thus improves the rework of the backlight module.

Still another embodiment of the present disclosure further provides a display device, which includes the backlight module described in the above embodiments, and thus the display device has a thin thickness and reduced production cost.

What is describe above is only specific embodiments of the present disclosure. However, the protection scope of the present disclosure is not limited thereto, and any change or substitution that can be readily conceived by a person skilled in the art within the technical scope of the present disclosure shall fall within the protection scope of the present disclosure. Therefore, the protection scope of the present disclosure should be defined by the claims.

What is claimed is:

1. A backplane, comprising:
a plate-like body for securing a rectangular printed circuit board (PCB),
wherein the body comprises:
a first clamping part corresponding to a first side edge of the PCB, the first clamping part having an L-shaped bend facing towards the PCB for clamping the first side edge; and
a second clamping part corresponding to a second side edge of the PCB, the second clamping part having a U-shaped bend facing towards the PCB for clamping the second side edge, the second clamping part comprising a first part, a second part being substantially parallel to the first part and a third part connecting the first part and the second part, the first part and the second part located substantially parallel to the body, the second clamping part being configured to clamp the second side edge between the first part and the second part, wherein the second side edge is parallel to the first side edge,
wherein a riveting column is secured on the body uncovered by the PCB, the riveting column is located at the same side of the PCB as the first clamping part, and a spring is rotatably secured on the riveting column and configured to press the PCB against the body, and
each of the first clamping part and the second clamping part is formed by a cut-out and bent portion of the body.

2. The backplane according to claim 1, wherein the spring is rotatably secured on the riveting column using a central axis of the riveting column as a rotation axis.

3. The backplane according to claim 1, wherein materials of the riveting column and the spring are both made of metal.

4. The backplane according to claim 1, wherein the body further comprises a third clamping part and a fourth clamping part respectively corresponding to a third side edge and a fourth side edge parallel each other on the PCB, and the third clamping part and the fourth clamping part have bends facing towards the PCB for clamping the third side edge and the fourth side edge.

5. The backplane according to claim 4, wherein the bend is an L-shaped bend or a U-shaped bend, and the bend of at most one of the third clamping part and the fourth clamping part is a U-shaped bend.

6. The backplane according to claim 1, wherein the riveting column and the body are secured by means of welding or screw joint.

7. The backplane according to claim 1, wherein at least one L-shaped bend and the U-shaped bend is shaped so that a gap between the at least one L-shaped bend and the U-shaped bend is approximately 0-0.2 mm when the PCB is secured on the body.

8. A backlight module, comprising:
a light bar for providing a light source; and
a backplane for securing a light guide plate,
the backplane comprising a plate-like body for securing a rectangle printed circuit board (PCB),
wherein the body comprises:
a first clamping part corresponding to a first side edge of the PCB, the first clamping part having an L-shaped bend facing towards the PCB for clamping the first side edge; and
a second clamping part corresponding to a second side edge of the PCB, the second clamping part having a U-shaped bend facing towards the PCB for clamping the second side edge, the second clamping part comprising a first part, a second part being substantially parallel to the first part and a third part connecting the first part and the second part, the first part and the second part located substantially parallel to the body, the second clamping part being configured to clamp the second side edge between the first part and the second part, wherein the second side edge is parallel to the first side edge,
wherein a riveting column is secured on the body uncovered by the PCB, the riveting column is located at the same side of the PCB as the first clamping part, and a spring is rotatably secured on the riveting column and configured to press the PCB against the body, and
each of the first clamping part and the second clamping part is formed by a cut-out and bent portion of the body.

9. The backlight module according to claim 8, wherein the spring is rotatably secured on the riveting column using a central axis of the riveting column as a rotation axis.

10. The backlight module according to claim 8, wherein materials of the riveting column and the spring are both made of metal.

11. The backlight module according to claim 8, wherein the body further comprises a third clamping part and a fourth clamping part respectively corresponding to a third side edge and a fourth side edge parallel each other on the PCB, and the third clamping part and the fourth clamping part have bends facing towards the PCB for clamping the third side edge and the fourth side edge.

12. The backlight module according to claim 11, wherein the bend is an L-shaped bend or a U-shaped bend, and the bend of at most one of the third clamping part and the fourth clamping part is a U-shaped bend.

13. The backlight module according to claim 8, wherein the riveting column and the body are secured by means of welding or screw joint.

14. The backlight module according to claim 8, wherein at least one of the L-shaped bend and the U-shaped bend is shaped so that a gap between the at least one of the L-shaped bend and the U-shaped bend is approximately 0-0.2 mm when the PCB is secured on the body.

15. A display device, comprising a backlight module, the backlight module comprising:
a light bar for providing a light source; and
a backplane for securing a light guide plate,
the backplane comprising
a plate-like body for securing a rectangle printed circuit board (PCB),
wherein the body comprises:
a first clamping part corresponding to a first side edge of the PCB, the first clamping part having an L-shaped bend facing towards the PCB for clamping the first side edge; and
a second clamping part corresponding to a second side edge of the PCB, the second clamping part having a U-shaped bend facing towards the PCB for clamping the second side edge, the second clamping part comprising a first part, a second part being substantially parallel to the first part and a third part connecting the first part and the second part, the first part and the second part located substantially parallel to the body, the second clamping part being configured to clamp the second side edge between the first part and the second part, wherein the second side edge is parallel to the first side edge,
wherein a riveting column is secured on the body uncovered by the PCB, the riveting column is located at the same side of the PCB as the first clamping part, and a spring is rotatably secured on the riveting column and configured to press the PCB against the body, and
each of the first clamping part and the second clamping part is formed by a cut-out and bent portion of the body.

16. The display device according to claim 15, wherein the spring is rotatably secured on the riveting column using a central axis of the riveting column as a rotation axis.

17. The display device according to claim 15, wherein materials of the riveting column and the spring are both made of metal.

18. The display device according to claim 15, wherein the body further comprises a third clamping part and a fourth clamping part respectively corresponding to a third side edge and a fourth side edge parallel each other on the PCB, and the third clamping part and the fourth clamping part have bends facing towards the PCB for clamping the third side edge and the fourth side edge.

19. The display device according to claim 18, wherein the bend is an L-shaped bend or a U-shaped bend, and the bend of at most one of the third clamping part and the fourth clamping part is a U-shaped bend.

20. The display device according to claim 15, wherein the riveting column and the body are secured by means of welding or screw joint, and
at least one of the L-shaped bend and the U-shaped bend is shaped so that a gap between the at least one of the L-shaped bend and the U-shaped bend is approximately 0-0.2 mm when the PCB is secured on the body.

* * * * *